Aug. 6, 1968 R. K. AITKEN 3,396,381

MULTI-INPUT MIXER FOR NULL SENSING DEVICES

Filed Oct. 8, 1964

United States Patent Office 3,396,381

Patented Aug. 6, 1968

3,396,381

MULTI-INPUT MIXER FOR NULL SENSING DEVICES

Robert K. Aitken, Port Washington, N.Y., assignor to Hazeltine Research, Inc., a corporation of Illinois Filed Oct. 8, 1964, Ser. No. 402,444
10 Claims. (Cl. 340—347)

ABSTRACT OF THE DISCLOSURE

Disclosed is a multi-input mixer which utilizes a plurality of parallel comparison circuits to compare each of a corresponding plurality of input signals with a nulling signal. Each comparison circuit develops a resultant signal representative of the difference in amplitude between its input signal and the nulling signal. A controlled switching circuit is connected between each comparison circuit and a common output terminal for coupling each of said resultant signals to the common output terminal one at a time under the control of a central control circuit. Other embodiments are covered.

This invention relates to a multi-input mixer for null sensing devices. As used in this application, the term "null sensing device" will be understood to include any electrical device which seeks a balance between a sample signal and an adjustable reference signal. While the invention may be used with any such device, it will be particularly described as it would be used with an analog-to-digital converter type of null sensing device.

As its name implies, an analog-to-digital converter type of null sensing device is used to convert an analog voltage into a digital signal representative of that voltage. Such a device operates by storing a binary number in a register, by developing an analog voltage from the binary number, by comparing the analog voltage so developed against the input analog voltage being converted, and by increasing or decreasing the binary number stored in the register according to the results of the comparison until the developed analog voltage is equal in amplitude and opposite in polarity to the input analog voltage. When such is the case, a null condition is said to exist and the binary number stored in the register at that time will be a digital representation of the input analog voltage.

Circumstances arise in which it is desired to sequentially convert a plurality of analog voltages into their respective digital signal representations. Such a circumstance arises, for example, where it is desired to monitor a great many analog functions and to generate digital output signals which can be stored for investigation at a later time or for telemetry purposes. The usual manner of performing the sequential conversion is to present each analog voltage to one input terminal of a multi-input terminal mixer and to sequentially switch each voltage through the mixer to an analog-to-digital converter connected to its output terminal, wherein the conversion is to be performed. If the rate at which the sequential conversions are to be made is not too rapid, for example, at the rate of one conversion every ten milliseconds, the switching of the voltages through the mixer may be carried out by conventional electromagentic relays. If the sequential conversions are to be made at a very rapid rate, however, for example, at the rate of one conversion every ten microseconds, transistors are normally used as the switching element instead of relays. As will be described hereinafter, the manner commonly used to connect the transistors as the switching elements within the mixer is such as to introduce some error into the analog-to-digital conversion. As a result of this error, the binary number stored in the aforementioned register at null will not be a precise digital representation of the analog voltage then being converted. While under certain circumstances a close approximation will be sufficient, in others a close approximation will not be good enough.

Objects of the present invention, therefore, are to provide a new and improved multi-input mixer for null sensing devices, in general, and for null sensing devices of the analog-to-digital converter type, in particular, which uses transistors as the switching elements and which provides highly accurate nulling information.

In accordance with a particular form of the present invention, a multi-input mixer for null sensing devices includes means for supplying a plurality of electrical input signals representative of data to be processed and means for supplying a nulling signal of varying amplitude for comparison against each of the supplied input signals. The mixer also includes a plurality of comparison circuits, each of which includes comparison means for comparing the amplitude of one of the input signals with the amplitude of the nulling signal and for providing a resultant signal representative of the difference in amplitudes of the two signals and electronic switching means for controlling the coupling of the resultant signals to an output terminal common to all of the comparison circuits, the switching means having an inherent impedance effect which introduces an error in coupling any finite signal to the aforementioned output terminal. The mixer further includes control means coupled to the comparison circuits for enabling the switching means in sequence so that only one of the switching means is enabled at any particular time. Lastly, the mixer is so constructed and arranged that highly accurate nulling information is provided at the aforementioned output terminal because at null, since the resultant signal goes to zero, there is no finite signal coupled through the enabled switching means to that output terminal and, therefore, there is no error introduced by the enabled switching means.

For a better understanding of the present invention together with other and further objects thereof, reference is had to the following description taken in connection with the accompanying drawing, and its scope will be pointed out in the appended claims.

Referring to the drawing.

Figures 1, 2:
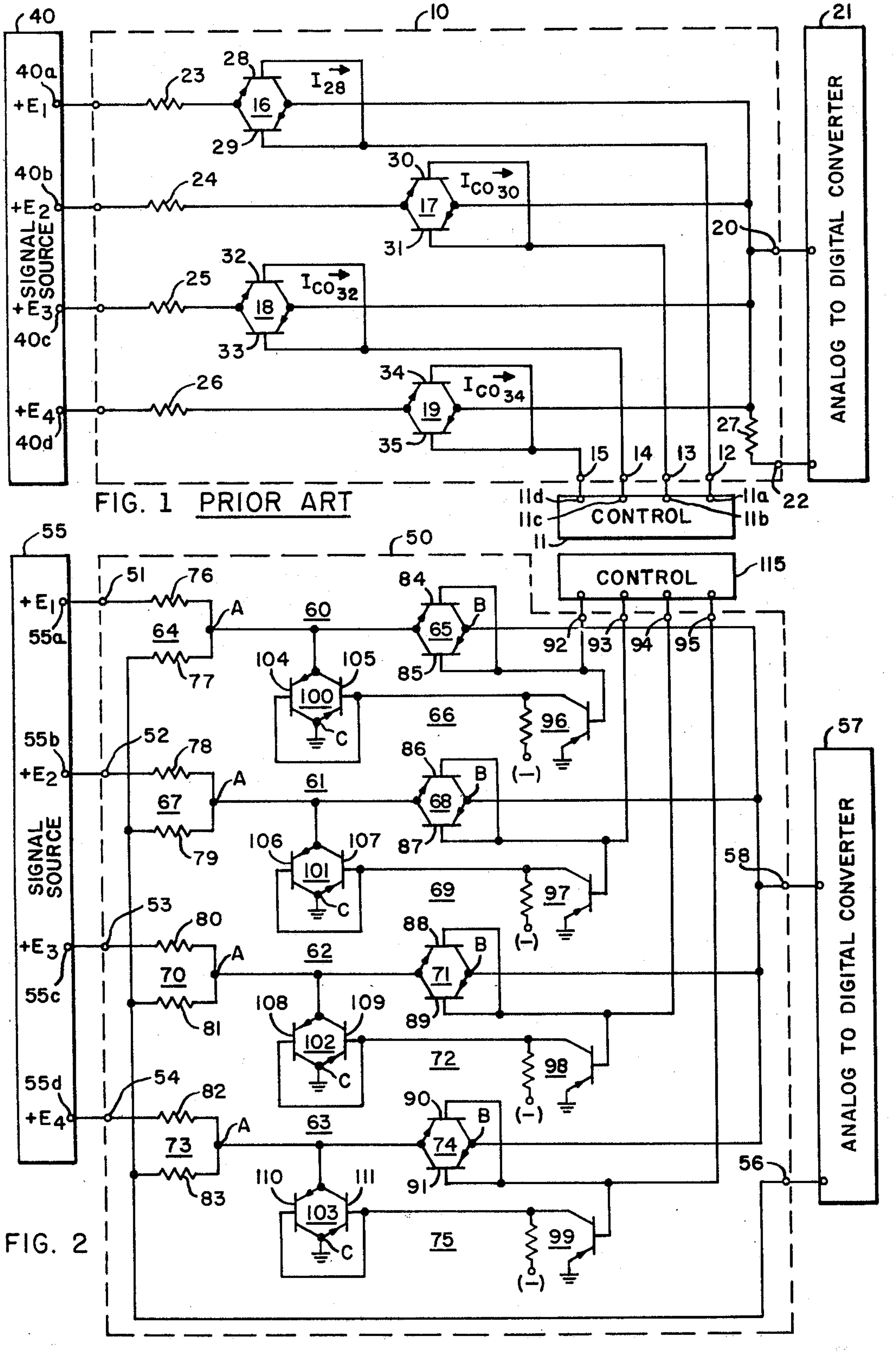
FIG. 1 shows a commonly used multi-input mixer arrangement using transistors as the switching elements.
FIG. 2 shows a multi-input mixer arrangement also using transistors as the switching elements but constructed in accordance with the present invention.

*Description and operation of the* FIG. 1 *prior art multi-input mixer*

Referring to FIG. 1, there is shown a commonly used multi-input mixer arrangement for null sensing devices, in general, and for null sensing devices of the analog-to-digital converter type, in particular. FIG. 1 is included in the application to illustrate the general operation of a multi-input mixer in such an environment and to point out two areas of operation which introduce error into the analog-to-digital conversion of an input voltage.

The operation of the multi-input mixer 10 of FIG. 1 is as follows. Assume that it is desired to convert input analog voltage $+E_1$ into its digital signal representation. For such a case, control 11, and more specifically, control terminal 11*a*, supplies a negative signal to mixer terminal 12 to enable transistor switch 16. Voltage $+E_1$ is thereby coupled through switch 16, via mixer terminal 20, to the analog-to-digital converter 21. Control terminals 11*b*, 11*c*, and 11*d* supply positive signals to mixer terminals 13, 14 and 15, respectively, to inhibit transistor switches 17, 18 and 19. Voltages $+E_2$, $+E_3$ and $\mp E_4$ are thereby prevented from reaching the converter 21. Converter 21 develops and presents to mixer terminal 22, in the conventional manner, a negative nulling voltage of constantly varying amplitude until a null balance indication of zero volts is produced at mixer terminal 20. The nulling voltage remains at this negative amplitude for as long as transistor switch 16 is enabled. If the operation of the mixer 10 were ideal, and the value of input resistor 23 were equal to the value of load resistor 27, this nulling voltage would be exactly equal in amplitude, though opposite in polarity, to the amplitude of the input voltage $+E_1$. The binary number stored in the register of converter 21 at this time, would then be a precise digital representation of voltage $+E_1$. Such is not the case in actual operation, however.

In the actual operation of the FIG. 1 mixer for the case chosen, two sources of error are introduced by the inherent impedance effect of the transistor switches—one, because transistor switch 16 does not act as a perfect "short" circuit when it is enabled and one, because transistor switches 17, 18 and 19 do not act as perfect "open" circuits when they are inhibited. That is, when transistor switch 16 is enabled and, more particularly, when transistor 28 is turned "on" by the negative signal supplied by control terminal 11*a*, instead of there being no voltage developed across its collector and emitter terminals, as would be the case if transistor 28 were acting as a perfect "short" circuit, a saturation voltage $V_{CE}$ is in fact developed. This voltage $V_{CE_{28}}$ is a function of the magnitude of the D-C current flowing through transistor 28 in the direction shown. In addition, when transistor switches 17, 18 and 19 are inhibited and, more particularly, when transistors 30, 32 and 34 are turned "off" by the positive signal supplied by control terminals 11*b*, 11*c* and 11*d*, respectively, instead of there being no current flowing through transisors 30, 32 and 34, as would be the case were they acting as perfect "open" circuits, a small D-C current does in fact flow through each of these transistors. These D-C currents are shown in FIG. 1 as $I_{CO_{30}}$, $I_{CO_{32}}$, and $I_{CO_{34}}$. Thus, because of the inherent impedance effects of transistor switches 16, 17, 18 and 19, two sources of error $V_{CE_{28}}$ and $(I_{CO_{30}}+I_{CO_{32}}+I_{CO_{34}})\ R_{27}$, are introduced into the analog-to-digital conversion. These sources of error are additive, are variable with temperature, are variable with transistor aging, and are variable with the amplitude of the analog voltage being converted.

As a result of these sources of error, the amplitude of the negative nulling voltage at null is not exactly equal to the amplitude of the analog voltage $+E_1$. Instead, it is equal to the sum of the amplitude of voltage $\mp E_1$ and the amplitude of the two voltages $V_{CE_{28}}$ and $$(I_{CO_{30}}+I_{CO_{32}}\mp I_{CO_{34}})$$

$R_{27}$. The binary number actually stored in the register in converter 21 at null, therefore, is not a precise digital representation of analog voltage $+E_1$. Moreover, since the error introduced varies in response to the several influences noted above, no permanent, accurate correction can be built into the FIG. 1 circuit.

*Description and operation of the* FIG. 2 *multi-input mixer*

There is shown in FIG. 2 a multi-input mixer 50 constructed in accordance with the present invention which substantially avoids the above-described limitations of the prior art multi-input mixer 10 of FIG. 1. As used with an analog-to-digital converter type of null sensing device, the multi-input mixer 50 of FIG. 2 includes means, such as input terminals 51, 52, 53 and 54, for supplying a plurality of analog voltages, each of which is to be converted into its respective digital signal representation. Input termials 51, 52, 53 and 54 are connected to signal source 55 which may represent, for example, a plurality of temperature sensing devices located at various points along an airborne aircraft engine. The analog voltages supplied to terminals 51, 52, 53 and 54 by source 55 could be either positive D-C voltages, negative D-C voltages, or rectified A-C voltages representing engine temperatures.

Multi-input mixer 50 also includes means, such as input terminal 56, for supplying a nulling signal of varying amplitude for comparison against each of the analog voltages supplied by signal source 55. Input terminal 56 is connected to an analog-to-digital converter 57 which presents a signal of constantly varying amplitude to this terminal 56 until a null balance indication appears at output terminal 58 of mixer 50.

Multi-input mixer 50 further includes a plurality of comparison circuits, for example, 60, 61, 62 and 63. Each comparison circuit includes comparison means for comparing the amplitude of the input analog voltages with the amplitude of the nulling signal and for providing resultant unidirectional voltage indications of the difference in amplitude between the signals. Each comparison circuit also includes electronic switching means for controlling the coupling of the resultant unidirectional voltage indications to output terminal 58 of the mixer 50. Each comparison circuit additionally includes clamping means for clamping to ground potential those resultant unidirectional voltage indications which are not coupled to output terminal 58 by the switching means. As shown in FIG. 2, the comparison means, the switching means, and the clamping means included in comparison circuit 60 are represented by the notations 64, 65 and 66. The corresponding means in comparison circuit 61 are designated 67, 68 and 69, respectively, while those in comparison circuit 62 are designated 70, 71, and 72 respectively, and those in comparison circuit 63 are designated 73, 74 and 75 respectively.

Referring to comparison circuit 60 in more detail, the comparison means 64 included therein includes a voltage divider network consisting of resistors 76 and 77. One end of resistor 76 is connected via input terminal 51 to terminal 55*a* of signal source 55 while one end of resistor 77 is connected via input terminal 56 to the analog-to-digital converter 57. The other end of resistors 76 and 77 are joined at point A and connected to transistors 84 and 85 which represent the electronic switching means 65 of comparison circuit 60. In particular, point A is connected to the junction of the emitter electrode of transistor 84 and the collector electrode of transistor 85. The collector electrode of transistor 84 and the emitter electrode of transistor 85 are similarly joined at point B and connected via output terminal 58 to the analog-to-digital converter 57. The base electrodes of transistors 84 and 85 are joined and connected to input terminal 92, at which terminal "on-off" gating control of transistors 84 and 85 is provided in a manner to be subsequently described. Switching means 65 is represented in FIG. 2 as "ganged" transistors 84 and 85 to provide control for resultant unidirectional voltages of either positive or negative polarity. One transistor would be sufficient, however, if the resultant voltage were known to be limited to one given polarity. Although transistors 84 and 85 are shown as PNP transistors, NPN transistors could be used just as easily. Certain modifications, obvious to the skilled artisan, would have to be made for mixer 50 to operate correctly, however.

Also connected to input terminal 92 and, more particularly, between input terminal 92 and junction point A, is the clamping means 66. As shown, clamping means 66 includes a conventional transistor inverter circuit 96 and a gated transistor arrangement 100 consisting of "ganged" transistors 104 and 105. It will be seen that this "gated" arrangement is similar in construction to the "gated" arrangement of transistors 84 and 85 of transistor switch 65. The effective output junction C of clamping means 66 is connected to ground potential.

The construction of comparison circuits 61, 62 and 63 differs from that of comparison circuit 60 only as regards the input terminals of mixer 50 to which the comparison means, the electronic switching means, and the clamping means of circuits 61–63 are connected. Although different numerical notations have been used to identify corresponding components in each of comparison circuits 61–63, it will be understood that these components are to be of the same type classification. The letter notations A, B and C have been retained intact in each comparison circuit, however.

The multi-input mixer 50 finally includes control means coupled to the comparison circuits for enabling the electronic switching means in a first sequence and for enabling the clamping means in an opposite sequence so that sequential conversion of the input analog voltages may be accomplished precisely, without the introduction into the analog-to-digital conversion of any errors due to the impedance characteristics of the transistor switches. This control means, shown as input terminals 92, 93, 94 and 95 in FIG. 2, is connected to, for example, a digital timing control source 115 which supplies proper polarity signals to input terminals 92, 93, 94 and 95 to enable the electronic switching means and the clamping means in comparison circuits 60, 61, 62 and 63 in their proper sequences.

The general operation of the multi-input mixer 50 of FIG. 2 is identical to that of the multi-input mixer 10 of FIG. 1. Thus, with analog voltages $+E_1$, $+E_2$, $+E_3$ and $+E_4$ supplied to input terminals 51, 52, 53 and 54 by signal source 55, and assuming it is desired to convert analog voltage $+E_1$ into its digital representation, control means 115 supplies a negative polarity signal to input terminal 92 and positive polarity signals to input terminals 93, 94 and 95. The negative polarity signal supplied to input terminal 92 is coupled to the base electrode of transistor 84 to enable transistor 84, while the positive polarity signal supplied to input terminals 93, 94 and 95 are coupled to the base electrode of transistors 86, 88 and 90, respectively, to inhibit each of them. For the condition assumed, i.e., all input analog voltages of positive polarity, none of the transistors 85, 87, 89 and 91 will be enabled by the control signals coupled to their respective base electrodes. It will be readily apparent that if the analog voltages supplied by signal source 55 to input terminals 52, 53 and 54 were of negative rather than positive polarity, the polarity of the control signal supplied to input terminals 93, 94 and 95 by control means 115 would also have to be negative in order to prevent the coupling of the analog voltages $E_2$, $E_3$ and $E_4$ (now negative) to the analog-to-digital converter 57. In either case, with transistor switch 65 enabled through transistor 84, the analog-to-digital converter 57 operates in a conventional manner to supply a nulling signal of continuously varying negative amplitude to input terminal 56 of mixer 50 until a null balance indication of zero volts is produced at output terminal 58.

With the multi-input mixer 50 of FIG. 2, the binary number stored in the register within the converter 57 at null will be a precise digital representation of analog voltage $+E_1$. That is, with the value of resistor 76 equal to the value of resistor 77, at null, the amplitude of the nulling signal will be exactly equal to the amplitude of analog voltage $+E_1$, rather than equal to the sum of the amplitude of voltage $+E_1$ and the amplitude of the two voltage $V_{CE_{28}}$ and $(I_{CO_{30}}+I_{CO_{32}}+I_{CO_{34}})\ R_{27}$ as was the case with mixer 10 of FIG. 1. This result is due to the combined effects of carrying out the comparison of the amplitude of the nulling signal against the amplitude of the input analog voltage $+E_1$ at a point in mixer 50 prior to the tranistor switch 65 and of clamping to ground potential the resultant unidirectional voltage indications associated with input analog voltages $+E_2$, $+E_3$ and $+E_4$.

Considering first the effect of carrying out the comparison at a point in the mixer 50 prior to transistor switch 65, it will be noted that until the amplitude of the negative nulling voltage is equal to the amplitude of analog voltage $+E_1$, a D-C current will flow through transistor 84 to output terminal 58. This flow of current will be detected by the analog-to-digital converter 57 which will increase the amplitude of the nulling signal supplied to input terminal 56 in the negative direction in the usual manner. As the amplitude of the nulling signal is increased, a point will be eventually reached at which the negative amplitude of the nulling signal will equal the positive amplitude of the analog votage $+E_1$. No D-C current will then flow through transistor 84 to output terminal 58. There will not, therefore, be any $V_{CE}$ voltage developed across transistor 84 and the junction points A and B will each be at zero volts. This null condition will exist for as long as transistor switch 65 is enabled. Thus, with the FIG. 2 mixer 50, the $V_{CE}$ voltage error that had previously existed has been eliminated from the conversion.

Considering next the effect of the clamping means 66, it will be noted that the positive polarity signal supplied by control source 115 to input terminals 93, 94 and 95 to inhibit transistor switches 68, 71 and 74 are of the proper polarity to enable transistors 106, 108 and 110 of the clamping means 69, 72 and 75, respectively. Junction point A in each comparison circuit 61, 62 and 63 is therefore clamped to ground potential. Since each junction point B in circuits 61–63 is also at ground potential at null, no voltage exists across transistor 86, 88 and 90 and, therefore, no $I_{CO}$ current flows through any of those transistors. Thus, the $I_{CO}$ error is also eliminated from the conversion. As a result, the analog-to-digital conversion of voltage $+E_1$ will be free of errors due to the inherent impedance effects of transistor switches 65, 68, 71 and 74.

The following table illustrates the sequences with which the electronic switching means and clamping means of the FIG. 2 mixer are enabled:

| Analog voltage to be Converted | Condition of electronic Switching Means | Condition of Clamping Means |
|---|---|---|
| $+E_1$ | Switch 65 enabled; switches 68, 71 and 74 inhibited. | Clamps 101, 102 and 103 enabled; clamp 100 inhibited. |
| $+E_2$ | Switch 68 enabled; switches 65, 71 and 74 inhibited. | Clamps 100, 102 and 103 enabled; clamp 101 inhibited. |
| $+E_3$ | Switch 71 enabled; switches 65, 68 and 74 inhibited. | Clamps 100, 101 and 103 enabled; clamp 102 inhibited. |
| $+E_4$ | Switch 74 enabled; switches 65, 68 and 71 inhibited. | Clamps 100, 101 and 102 enabled; clamp 103 inhibited. |

With the multi-input mixer shown in FIG. 2, therefore, the amplitude of the nulling signal will, at null, be exactly equal to, and opposite in polarity to, the input analog voltage being converted. Thus, the binary number stored in the register within the analog-to-digital converter 57 will be a precise digital representation of that analog voltage. The only limit to the accuracy of the analog-to-digital conversion will be set by the precision of the matched pairs of resistors 76 and 77, 78 and 79, 80 and 81, and 82 and 83. As long as the value of one resistor of each pair is equal to the value of the other resistor of that pair, highly accurate nulling information will be provided by multi-input mixer 50, whether the resistance value of one matched pair is equal to the resistance value of another matched pair or not. This represents another advantage over the prior art multi-input mixer 10 of FIG. 1 which required each input resistor 23, 24, 25 and 26 to be equal in value to the output resistor 27 so that the amplitude of the nulling signal would be equal to the amplitude of the input signal. In other words, the problem of obtaining many matched resistors for use in the FIG. 1 mixer to provide accurate nulling information does not exist in the FIG. 2 mixer, which requires the matching of only two resistors.

While there has been described what is at present considered to be the preferred embodiment of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A multi-input mixer for null sensing devices comprising:

means for supplying a plurality of input signals each representative of data to be processed;

means for supplying a nulling signal of varying amplitude for comparison with each of the supplied input signals;

a plurality of comparison means each for comparing the amplitude of a corresponding one of said input signals with the amplitude of said nulling signal and for providing a resultant signal representative of the difference in amplitude of said signals, said resultant signal being of zero value whenever said input signal and said nulling signal are equal in amplitude;

a plurality of controlled semiconductor switching means normally in a disabled state, each connected between a corresponding one of said comparison means and a common output terminal for coupling a corresponding one of said resultant signals to said common output terminal only when enabled, and for accurately so coupling said resultant signal when of zero value;

and control means coupled to each of said switching means, for enabling said switching means only one at a time and in a predetermined sequence.

2. A mixer in accordance with claim 1 wherein said mixer includes a plurality of controlled clamping means normally in an enabled state, each for clamping the resultant signal input of a corresponding one of said switching means to a reference potential only when enabled and only when said switching means is in a disabled state, and wherein said control means is coupled to each of said clamping means, for disabling said clamping means only one at a time in said predetermined sequence.

3. A mixer in accordance with claim 1, wherein each of said switching means includes a normally disabled transistor switch, coupled between the corresponding comparison means and said output terminal, which when disabled provides a substantially open circuit connection therebetween for said resultant signal and which when enabled, by said control means, provides a substantially short circuit connection therebetween for said resultant signal.

4. A mixer in accordance with claim 1 wherein each of said comparison means is a resistor network having a corresponding input signal supplied to a first terminal and having said nulling signal supplied to a second terminal, and wherein said resultant signal is developed at a third terminal of said network.

5. A mixer in accordance with claim 2 wherein each of said clamping means includes a normally enabled transistor switch, coupled between the resultant signal input of a corresponding one of said switching means and a source of reference potential, which when enabled provides a substantially short circuit connection therebetween, and which when disabled by said control means provides a substantially open circuit connection therebetween.

6. A mixer circuit in accordance with claim 3 wherein said transistor switch includes a single transistor connected in series via its emitter and collector terminals, between the corresponding comparison means and said output terminal, and having its base terminal coupled to said control means.

7. A mixer in accordance with claim 3 wherein said transistor switch includes a pair of ganged transistors connected in series via their emitter and collector terminals between the corresponding comparison means and said output terminal and having their base terminals coupled to said control means.

8. A mixer in accordance with claim 5 wherein said transistor switch includes a single transistor connected in series, via its emitter and collector terminals, between the resultant signal input of said switching means and said source of reference potential, and having its base terminal coupled to said control means.

9. A mixer in accordance with claim 5 wherein said transistor switch includes a pair of ganged transistors connected in series via their emitter and collector terminals between the resultant signal input of said switching means and said source of reference potential, and having their base terminals coupled to said control means.

10. A multi-input mixer for null sensing devices, comprising:

means for supplying a plurality of input signals each representative of data to be processed;

means for supplying a nulling signal of varying amplitude for comparison with each of the supplied input signals;

a plurality of resistor networks, each having a corresponding input signal supplied to a first terminal thereof and having said nulling signal supplied to a second terminal thereof, for comparing the amplitude of a corresponding one of said input signals with the amplitude of said nulling signal and for providing at a third terminal of each network a resultant signal representative of the difference in amplitude of said signals, said resultant signal being of zero value whenever said input signal and said nulling signal are equal in amplitude;

a plurality of controlled transistor switches normally in a disabled state, each coupled between the third terminal of a corresponding comparison means and a common output terminal, each for coupling a corresponding one of said resultant signals to said common output terminal only when enabled, and for accurately coupling said resultant signal when of zero value, said transistor switches when disabled providing a substantially open circuit connection between the corresponding comparison means and said output terminal for said resultant signal, and when enabled providing a substantially short circuit connection therebetween for said resultant signal;

a plurality of controlled clamping means normally in an enabled state, each for clamping the resultant signal input of a corresponding one of said transistor switches to a reference potential only when enabled, each of said clamping means when enabled providing a substantially short circuit connection between the resultant signal input of a corresponding one of said transistor switches and said reference potential, and when disabled, providing a substantially open circuit connection therebetween;

and control means coupled to each of said controlled transistor switches and to each of said controlled clamping means for enabling said transistor switches only one at a time and in a predetermined sequence, and for disabling the corresponding clamping means only one at a time and in said predetermined sequence.

References Cited

UNITED STATES PATENTS

| | | | |
|---|---|---|---|
| 2,960,690 | 11/1960 | Curtis | 340—347 |
| 3,089,963 | 5/1963 | Djorup | 307—88.5 |
| 3,145,376 | 8/1964 | Currie | 340—347 |

MAYNARD R. WILBUR, *Primary Examiner.*

G. R. EDWARDS, *Assistant Examiner.*